US005668551A

United States Patent [19]
Garavan et al.

[11] Patent Number: 5,668,551
[45] Date of Patent: Sep. 16, 1997

[54] POWER-UP CALIBRATION OF CHARGE REDISTRIBUTION ANALOG-TO-DIGITAL CONVERTER

[75] Inventors: Patrick J. Garavan, Limerick; Eanonn Byrne, Mallow, both of Ireland

[73] Assignee: Analog Devices, Inc., Norwood, Mass.

[21] Appl. No.: 374,169

[22] Filed: Jan. 18, 1995

[51] Int. Cl.⁶ ................................................. H03M 1/10
[52] U.S. Cl. ........................................... 341/120; 341/172
[58] Field of Search ................................. 341/120, 172, 341/155, 156, 144, 150

[56] References Cited

U.S. PATENT DOCUMENTS

| | | | |
|---|---|---|---|
| 3,286,232 | 11/1966 | Stanford | 340/146.2 |
| 3,988,689 | 10/1976 | Ochi et al. | 330/51 |
| 4,077,035 | 2/1978 | Yee | 340/347 DA |

(List continued on next page.)

FOREIGN PATENT DOCUMENTS

| | | |
|---|---|---|
| 0 021 650 A1 | 1/1981 | European Pat. Off. . |
| 0 064 147 | 11/1982 | European Pat. Off. . |
| 0 151 469 A3 | 8/1985 | European Pat. Off. . |
| 0 234 034 A1 | 9/1987 | European Pat. Off. . |
| 0 281 155 A2 | 9/1988 | European Pat. Off. . |
| 0 360 914 | 4/1990 | European Pat. Off. . |
| 0 407 675 A1 | 1/1991 | European Pat. Off. . |
| 27 27 634 | 12/1977 | Germany . |
| 28 14 754 A1 | 10/1978 | Germany . |
| 30 03 099 | 7/1980 | Germany . |
| 30 13 333 | 10/1980 | Germany . |
| 35 21 224 A1 | 12/1986 | Germany . |
| 53-42438 | 10/1979 | Japan . |
| 919076 | of 0000 | U.S.S.R. . |
| 1402698 | 8/1975 | United Kingdom . |
| 1518558 | 7/1978 | United Kingdom . |
| 2 008 350 | 5/1979 | United Kingdom . |
| WO 82/00390 | 2/1982 | WIPO . |
| WO 93/19534 | 9/1993 | WIPO . |

OTHER PUBLICATIONS

Akazawa, Y., et al., "New Linearity Error Correction Technology for A/D and D/A Converter LSI", *Japanese Journal of Applied Physics*, vol. 22 (1983) Supplement 22–1, pp. 115–119.

Allstot, D. J. et al., "An Electrically–Programmable Switched Capacitor Filter," IEEE J. Solid–State Circuits, vol. SC–14, No. 6, Dec. 1979, pp. 1034–1041.

Allstot, D. J., "A Precision Variable–Supply CMOS Comparator," IEEE Journal Solid–State Circuits, vol. SC–17, No. 6, pp. 1080–1087, Dec. 1982.

Analog Devices, 1992 Data Converter Reference Manual, product #AD682, 4–41 and 4–47 to 4–48.

Analog Devices, Preliminary Technical Data, product #AD7882, Sep. 1993, pp. 1–12.

Beresford, R., "A self–calibrating d–a converter," Electronics, Sep. 22, 1981, p. 144.

Bienstman, L. A. et al., "An 8–Channel 8b μP Compatible NMOS Converter wth Programmable Ranges," 1980 IEEE International Solid–State Circuits, Conference, pp. 16–17.Bienstman, L. A. et al., "An Eight–Channel 8 Bit Microprocessor Compatible NMOS D/A Converter with Programmable Scaling," IEEE J. Solid–State Circuits, vol. SC–15, No. 6, Dec. 1980, pp. 1051–1058.

(List continued on next page.)

*Primary Examiner*—Brian K. Young
*Attorney, Agent, or Firm*—Wolf, Greenfield & Sacks, P.C.

[57] ABSTRACT

Using a power-up delay circuit on an analog/digital converter integrated circuit (i.e., an analog-to-digital converter or a digital-to-analog converter) to generate a signal delayed from power-up, and initiating a calibration of the converter upon detecting the delayed signal. In preferred embodiments, calibration can also be initiated in response to a signal on a calibration input pin of the integrated circuit, and the duration of the delay can be derived from a reference (e.g., by charging an external capacitor with it) or from the duration of a calibration operation. Circuitry can be provided to automatically place the circuit in an operating mode upon power-up that keeps the integrated circuit in shutdown mode when it is not converting or calibrating.

41 Claims, 5 Drawing Sheets

U.S. PATENT DOCUMENTS

| | | | |
|---|---|---|---|
| 4,129,863 | 12/1978 | Gray et al. | 340/347 AD |
| 4,143,361 | 3/1979 | Tammes et al. | 340/347 CC |
| 4,144,527 | 3/1979 | Butler et al. | 341/347 AD |
| 4,180,807 | 12/1979 | Eichelberger et al. | 340/347 AD |
| 4,190,854 | 2/1980 | Redfern | 357/51 |
| 4,191,900 | 3/1980 | Redfern et al. | 307/355 |
| 4,222,107 | 9/1980 | Mrozowski et al. | 364/571 |
| 4,250,494 | 2/1981 | Butler et al. | 340/347 CC |
| 4,272,760 | 6/1981 | Prazak et al. | 340/347 CC |
| 4,295,089 | 10/1981 | Cooperman | 323/351 |
| 4,348,658 | 9/1982 | Carter | 340/347 AD |
| 4,399,426 | 8/1983 | Tan | 340/347 CC |
| 4,429,282 | 1/1984 | Saari | 330/9 |
| 4,439,693 | 3/1984 | Lucas et al. | 330/9 |
| 4,458,237 | 7/1984 | Lomogalla | 340/347 AD |
| 4,517,549 | 5/1985 | Tsukakoshi | 340/347 AD |
| 4,542,354 | 9/1985 | Robinton et al. | 332/11 D |
| 4,543,953 | 10/1985 | Slocum et al. | 341/120 |
| 4,553,052 | 11/1985 | Takahashi | 307/494 |
| 4,555,668 | 11/1985 | Gregorian et al. | 330/9 |
| 4,563,654 | 1/1986 | Arai et al. | 330/277 |
| 4,577,228 | 3/1986 | Arai et al. | 358/167 |
| 4,620,179 | 10/1986 | Cooper et al. | 340/347 AD |
| 4,654,815 | 3/1987 | Marin et al. | 364/606 |
| 4,677,422 | 6/1987 | Naito | 340/347 SH |
| 4,700,174 | 10/1987 | Sutherland et al. | 340/347 CC |
| 4,709,225 | 11/1987 | Welland et al. | 340/347 CC |
| 4,777,451 | 10/1988 | Tohyama | 330/253 |
| 4,803,462 | 2/1989 | Hester et al. | 341/172 |
| 4,804,960 | 2/1989 | Fernandes et al. | 341/158 |
| 4,812,817 | 3/1989 | Bernard | 341/172 |
| 4,829,266 | 5/1989 | Pernici et al. | 330/253 |
| 4,831,381 | 5/1989 | Hester | 341/172 |
| 4,833,418 | 5/1989 | Quintus et al. | 330/9 |
| 4,881,044 | 11/1989 | Kinoshita et al. | 330/253 |
| 4,883,987 | 11/1989 | Fattaruso | 307/355 |
| 4,907,002 | 3/1990 | Kawada | 341/172 |
| 4,982,194 | 1/1991 | Bacrania et al. | 341/172 |
| 5,006,853 | 4/1991 | Kiriaki et al. | 341/156 |
| 5,014,055 | 5/1991 | Dingwall et al. | 341/159 |
| 5,016,014 | 5/1991 | Bitting | 341/162 |
| 5,036,322 | 7/1991 | Barrow et al. | 341/144 |
| 5,043,732 | 8/1991 | Robertson et al. | 341/156 |
| 5,047,665 | 9/1991 | Burt | 307/355 |
| 5,077,489 | 12/1991 | Gola et al. | 307/362 |
| 5,124,663 | 6/1992 | McEntarfer et al. | 330/9 |
| 5,138,319 | 8/1992 | Tesch | 341/156 |
| 5,184,130 | 2/1993 | Mangelsdorf | 341/156 |
| 5,220,206 | 6/1993 | Tsang et al. | 307/296.3 |
| 5,233,180 | 8/1993 | Tsuruta et al. | 250/208.1 |
| 5,235,333 | 8/1993 | Naylor et al. | 341/118 |
| 5,245,223 | 9/1993 | Lim et al. | 307/362 |
| 5,248,974 | 9/1993 | Fattaruso et al. | 341/172 |
| 5,272,395 | 12/1993 | Vincelette | 307/355 |
| 5,381,148 | 1/1995 | Mueck et al. | 341/139 |
| B1 4,399,426 | 8/1983 | Tan | 340/347 CC |

OTHER PUBLICATIONS

Bon, M. et al., "All–Symbolic Analysis Technique for Multiphase Switched Capacitor Networks," pp. 655–660 (no date given).

Cooperman, M. et al., "Charge Redistribution Codec," J. Solid–State Circuits, vol. SC–16, No. 3, pp. 155–162, Jun. 1981.

Crystal Semiconductor Corporation, "16–Bit, 100 kHz Serial–Output A/D Converter", Preliminary Product Information, DS45PP2, Jan. 1989, pp. B–95–B115.

Dannenberg, R. E., "Closed Loop Digital–to–Analog Conversion," IBM Technical Disclosure Bulletin, vol. 20, No. 6, pp. 2332–2333, Nov. 1977.

De Wit, M, et al., "A Low–Power 12–b Analog–to–Digital Converter with On–Chip Precision Trimming," IEEE J. of Solid–State Circuits, vol. 28, No. 4, Apr. 1993, pp. 455–461.

Dobberstein, E. A., "Auto–Preregulating Coverter with Surge Control," IBM Technical Disclosure Bulletin, vol. 23, No. 8, pp. 3556–3558, Jan. 1981.

Eriksson, S., "Realization of Synchronous Wave Switched–Capacitor Filters," Dept. of Electrical Eng., Linköping University, Linköping, Sweden, pp. 650–654 (no date given).

Fiedler, H. L. et al., "A 5–Bit Building Block for 20 MHz A/D Converters," IEEE J. Solid–State Circuits, vol. SC–16, No. 3, pp. 151–155, Jun. 1981.

Fotouhi, B. et al., "An NMOS 12b Monotonic 25µs A/D Converer," 1979 IEEE International Solid–State Circuits, Conference, pp. 186–187 (no date given).

Fotouhi, B. et al., "High–Resolution A/D Conversion in MOS/LSI," IEEE J. Solid–State Circuits, vol. SC–14, No. 6, Dec. 1979, pp. 920–926.

Gheewala, T. R., "Parallel, Flux Redistribution D/A and A/D Converters," IBM Technical Disclosure Bulletin, vol. 20, No. 6, pp. 2480–2482, Nov. 1977.

Gillis, M. A., et al., "Supply Tracking Digital–to–Analog Converter," IBM Technical Disclosure Bulletin, vol. 20, No. 11A, Apr. 1978, pp. 4507–4508.

Gregorian, R. et al., "Offset Free High–Resolution D/A Converter," American Microsystems, Inc., Santa Clara, CA, 1980, pp. 316–319.

Gregorian, R., "High–resolution switched–capacitor D/A converter," Microelectronics Journal, vol. 12, No. 2, 1981, pp. 10–13.

Gregorian, R, et al., "An Integrated Single–Chip PCM Voice Codec with Filters," IEEE J. Solid–State Circuits, vol. SC–16, No. 4, Aug. 1981, pp. 322–333.

Hague et al., "Two Chip PCM Voice Codec with Filters," IEEE J. Solid–State Circuits, vol. SC–14, No. 6, Dec. 1979, pp. 963–964.

Hamade, A. R. et al., "A Single–Chip 8–Bit A/D Converter," IEEE J. Solid–State Circuits, Dec. 1976 vol. SC–11, No. 6, pp. 154–155.

Hampel, D, et al., "Application of Monolithic CMOS Switched–Capacitor Filters and Amplifiers for Signal Processing," IEEE Trans. on Communications, vol. COM–28, No. 10, Oct. 1980, pp. 1828–1831.

Herbst, D. et al., "Master–Slice SC Filters," Lehrstuhl Bauelemente der Elektrotechnik, University of Dortmund, West Germany, pp. 639–643 (no date given).

Holloway, L., "Elimination of Offset During Analog–to–Digital Conversion," IBM Technical Disclosure Bulletin, vol. 19, No. 9, Feb. 1977, pp. 3610–3611.

Hornak, T. et al., "A High Precision Component–Tolerant A/D Converter," IEEE J. Solid–State Circuits, vol. SC–10, No. 6, Dec. 1975, p. 386.

Iwata, A. et al., "Low Power PCM CODEC and Filter System" IEEE J. Solid–State Circuits, vol. SC–16, No. 2, Apr. 1981, pp. 73–79.

Kleine, U. et al., "Real–Time Programmable Unit–Element SC Filter for LPC Synthesis," Electronics Letters, Aug. 20, 1981, vol. 17, No. 17, pp. 600–602.

Kurth, C. F. et al., "Two–Port Analysis of Cascaded Switched–Capacitor Networks," IEEE 1978.

Kurth, C.F., "Two–Port Analysis of SC Networks with Continuous Input Signals," The Bell System Technical Journal, vol. 59, No. 8, Oct. 1980, pp. 1297–1316.

Lee, H.S. et al., "Self–Calibration Technique for A/D Converters," IEEE Trans. on Circuits and Systems, vol. CAS–30, No. 3, Mar. 1983, pp. 188–190.

Lee, H. S. et al., "A Self–Calibrating 12b 12µs CMOS ADC," 1984 IEEE International Solid–State Circuits Conference, pp. 64–65, 319.

Lee, H. S. et al., "Accuracy Considerations in Self–Calibrating A/D Converters," IEEE Trans. on Circuits and Systems, vol. CAS–32, No. 6, Jun. 1985, pp. 590–597.

Lee, H. S. et al., "A Direct Code Error Calibration Technique for Two–Step Flash A/D Converters," IEEE Trans. Circuits Syst., vol. 36, No. 6, pp. 919–922, Jun. 1989.

Lueder, E. et al., "Equivalent Sampled Data Filter Structures adn Some of Their Properties," IEEE 1978, pp. 752–755.

Maio, K. et al., "An Untrimmed D/A Converter with 14–Bit Resolution," J. Solid–State Circuits, vol. SC–16, No. 6, pp. 616–620, Dec. 1981.

McCrear, J.L. et al., "All–MOS Charge Redistribution Analog–to–Digital Conversion Techniques—Part I", IEEE J. Solid–State Circuits, SC–10, Dec. 1975, pp. 371–379.

McCreary, J. L. et al., "Precision Capacitor Ratio Measurement Technique for Integrated Circuit Capacitor Arrays," IEEE Trans. on Instrumentation and Measurment, vol. IM–28, No. 1, Mar. 1979, pp. 11–17.

Poujois, R. et al., "A Low Drift Fully Integrated MOSFET Operational Amplifier," IEEE Journal Solid–State Circuits, vol. SC–13, No. 4, Aug. 1978, pp. 499–503.

Pryce, D., "Self–Calibrating A/D Converters, Monolithic devices enhance accuracy and linearity," EDN, Jan. 20, 1992, pp. 53–64.

Rosenthal, L. A., "Improved Frequency Meter Circuit," IEEE Trans. on Instrumentation and Measurement, vol. IM–26, No. 4, Dec. 1977, p. 421.

Schulz, R. A. et al., "Analog–to–Digital Converter with Noise Rejection", IBM Technical Disclosure Bulletin, vol. 15, No. 6, Nov. 1972, pp. 2007–2008.

Schweer, B. et al., "Synthesis and Analysis Programs for VIS–SC Filters," Lehrstuhl Bauelemente der Elektrotechnik, University of Dortmund, West Germany, pp. 644–648 (no date given).

Suarez, R. E., et al., "All–CMOS Charge Redistribution Analog–to–Digital Conversion Techniques —Part II," IEEE J. Solid–State Circuits, vol. SC–10, No. 6, Dec. 1975, pp. 379–384.

Tan, K. S., et al., "A 5V, 16b 10µs Differential CMOS ADC", 1990 IEEE International Solid State Circuits Conference, pp. 166–167 (no date given).

Timko, M. P., "Circuit Techniques for Achieving High Speed–High Resolution A/D Conversion," IEEE J. Solid–State Circuits, vol. SC–15, No. 6, Dec. 1980, pp. 1040–1050.

Tröster, G. et al., "Error Cancellation Technique for Capacitor Arrays in A/D and D/A Converters," IEEE Trans. Circuits Syst., vol. 35, No. 6, pp. 749–751, Jun. 1988.

Yamakido, K. et al., "Single–Chip CMOS Filter/Codec," J. Solid–State Circuits, vol. SC–16 No. 4, Aug. 1981, pp. 302–307.

Yee, Y.S., "Adaptive Reference Voltage Adjustment for an Analog–to–Digital Converter", IBM Technical Disclosure Bulletin, vol. 19, No. 6, Nov. 1976, pp. 2360–2362.

Yee, Y.S. et al., "A Two–State Weighted Capacitor Network for D/A–A/D Conversion", IEEE J. Solid–State Circuits, vol. SC–14, No. 4, Aug. 1979, pp. 778–781.

POWER-UP CALIBRATION OF CHARGE REDISTRIBUTION ANALOG-TO-DIGITAL CONVERTER

FIELD OF THE INVENTION

This application relates to calibration of analog-to-digital converters, and more particularly to circuitry that automatically initiates calibration of a charge redistribution analog-to-digital converter on start up, once it has reached its normal operating conditions.

BACKGROUND OF THE INVENTION

It is known to construct charge redistribution analog-to-digital converters (ADC's) using integrated circuit technology. These integrated ADC's trap a charge proportional to the analog voltage to be measured, and then gauge the amount of charge trapped by testing it against differently-sized capacitors in an array. They tend to remain linear over their operating temperature range because the capacitance of capacitors made using integrated circuit technology usually does not to vary much in response to temperature changes. In addition, because the capacitors are in parallel, only differences in their temperature coefficients will affect linearity, and these differences can be significantly reduced by closely integrating the arrays.

These performance characteristics are not usually available immediately after supplying power to the part. Typically, the part must be allowed to settle before it reaches normal operating conditions, which can be defined as a state where the device operates consistently within a certain range of performance parameters, such as accuracy, linearity, or offset ranges. Before the part reaches this condition, its performance is affected by transient effects within the part, such as the charging of capacitors, or possibly the warming of circuit components.

It is known to provide calibration circuitry for these converters to compensate for manufacturing tolerances, drifts, or the like. For example, the calibration circuitry can include a switched array of capacitors that acts like a variable capacitor. This type of array can be connected in parallel with a capacitor in the ADC to allow adjustment of the total capacitor capacitance until it reaches a desired value. Typically, initiating a calibration operation involves asserting a signal on a calibration control pin, or providing a calibration command to a control register within the part via the part's bus interface, and calibration is usually not initiated until the part has been powered up for a certain interval, to allow the converter to reach its normal operating conditions.

Analog-to-digital converters can also include "shutdown" circuitry, which reduces power consumption to a minimum. When the converter is in shutdown mode, the analog circuitry in the converter receives only very small leakage currents. Upon returning from shutdown mode to normal operation, the ADC circuitry should generally be allowed to again reach normal operating conditions before relying on conversion values, to ensure accurate results.

Present converters usually require that the system designer provide circuitry and/or software that initiates power-up calibration. In addition, if the user intends to immediately place the part in shutdown mode after power-up, the user must typically first initiate calibration of the part and then provide a shutdown command to the part.

SUMMARY OF THE INVENTION

Generally, the invention features using a power-up delay circuit on an analog/digital converter integrated circuit (i.e., an analog-to-digital converter or a digital-to-analog converter) to generate a signal delayed from power-up, and initiating a calibration of the converter upon detecting the delayed signal. In preferred embodiments, calibration can also be initiated in response to a signal on a calibration input pin of the integrated circuit, and the duration of the delay can be derived from a reference (e.g., by charging an external capacitor with it) or from the duration of a calibration operation. Circuitry can be provided to automatically place the circuit in an operating mode upon power-up that keeps the integrated circuit in shutdown mode when it is not converting or calibrating.

The circuitry according to the invention is advantageous in that the system that incorporates it does not have to provide a power-up calibration command. In addition, the user may benefit from an automatic shutdown on power-up mode, which further reduces system requirements. The circuitry therefore permits the user to obtain the advantages of a calibrated charge-redistribution ADC without having to allocate as much design time or system resources to calibration issues as might otherwise be required. If desired, the user may even be able to ignore calibration issues altogether, and think of a thus-calibrated ADC as a low power, high accuracy black box that simply supplies digital voltage values at its output.

By providing power-up calibration control circuitry on-chip, the power-up delay can be determined by circuitry that is influenced by the same factors as the converter itself. The power-up delay can therefore be closely matched to the time required for the converter to reach normal operating conditions. This allows the circuit to become operable as quickly as possible, without sacrificing accuracy.

In one embodiment of the invention, there need be no external calibration pin at all, which can reduce both converter circuit costs and system costs.

3

DETAILED DESCRIPTION

Figure 1:
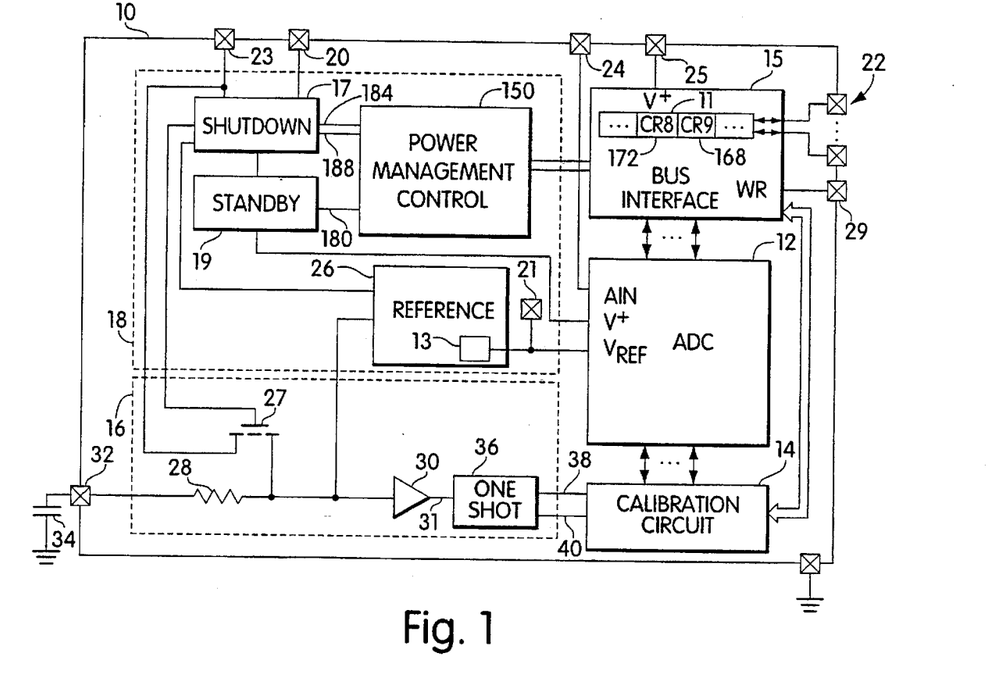
FIG. 1 is a schematic diagram illustrating a charge redistribution analog-to-digital converter integrated circuit with power management and power-up control circuitry according to one embodiment of the invention.

Referring to FIG. 1, an analog-to-digital converter integrated circuit (IC) 10 includes a charge redistribution ADC circuit 12, a calibration circuit 14, a bus interface 15, a power-up calibration control circuit 16, and a power management circuit 18. The ADC circuit and calibration circuit can be designed in accordance with commonly-assigned copending applications entitled "LOW VOLTAGE CMOS COMPARATOR," filed Apr. 29, 1994 under Ser. No. 08/235,557; "LOW VOLTAGE CMOS ANALOG-TO-DIGITAL CONVERTER," filed Apr. 29, 1994 under Ser. No. 08/236,509; and "CHARGE REDISTRIBUTION ANALOG-TO-DIGITAL CONVERTER WITH SYSTEM CALIBRATION," filed Apr. 29, 1994 under Ser. No. 08/235,087.

The ADC circuit 12 is operatively connected to an analog input pin 24, as well as to the bus interface 15, which has one or more bidirectional digital bus lines operatively connected to a series of digital bus lines 22. As is well known, the ADC circuit provides digital representations of the analog voltage measured at the analog input pin on the bus output lines of the bus interface. As is also well known, the bus lines are connected to an IC command register 11 in the bus interface, which allows the part to exchange status and control information with a microprocessor (not shown), under the control of a read/write line 29. Other types of interfaces, such as a serial interface with two unidirectional data lines, could of course be used instead.

The calibration circuit 14 can include several switched arrays of capacitors that act as variable capacitors. These variable capacitors can be connected in parallel with different capacitors in the ADC circuit 12 to adjust the total capacitances. The calibration circuit can be used to calibrate the gain, offset, and/or linearity of the converter. Other types of calibration circuitry may also be used, such as adjustable resistors or gains. For some more detailed information about calibration of charge-redistribution analog-to-digital converters, the reader may consult the above-referenced copending applications.

The power management circuit 18 manages the use of power received from the IC's positive analog voltage supply pin 23. It includes a reference circuit 26, as well as a power management control circuit 150, which is operatively connected to control inputs of a shutdown circuit 17 and a standby circuit 19. The shutdown circuit includes switching circuitry that can stop the flow of power to substantially all of the analog circuitry on the IC 10, leaving only a small leakage current from the voltage supply. The standby circuit similarly includes switching circuitry that shuts down most of the analog circuitry on the IC, but it leaves a reference 26 in a powered-up state.

The reference 26 is a band-gap voltage reference circuit with several associated current supply outputs. It supplies a reference voltage to the ADC circuit 12, as well as various bias currents. The reference voltage can be supplied by a high-impedance internal band-gap reference circuit 13, or this reference can be overdriven by an external reference at a reference input pin 21 on the IC 10. In an alternative embodiment of the invention, there is a reference out pin and a reference in pin, so that the external reference does not need to overdrive the internal reference.

The power-up control circuit 16 preferably includes a resistor 28 with a first lead operatively connected to one of the current sources in the reference 26, to the drain of a hold transistor 27, and to the input of a TTL-compatible input buffer 30. The second lead of the resistor is connected to protection diodes (not shown) and a calibration input pin 32, which is designed to be connected to an external calibration capacitor 34. The source of the hold transistor is operatively connected to the positive analog voltage supply pin 23, while its gate is operatively connected to a control output of the shutdown circuit. The output of the TTL-compatible input buffer 30 is operatively connected to a one-shot 36, which has first and second outputs 38, 40 that are operatively connected to control inputs of the calibration circuit 14.

Figure 2:
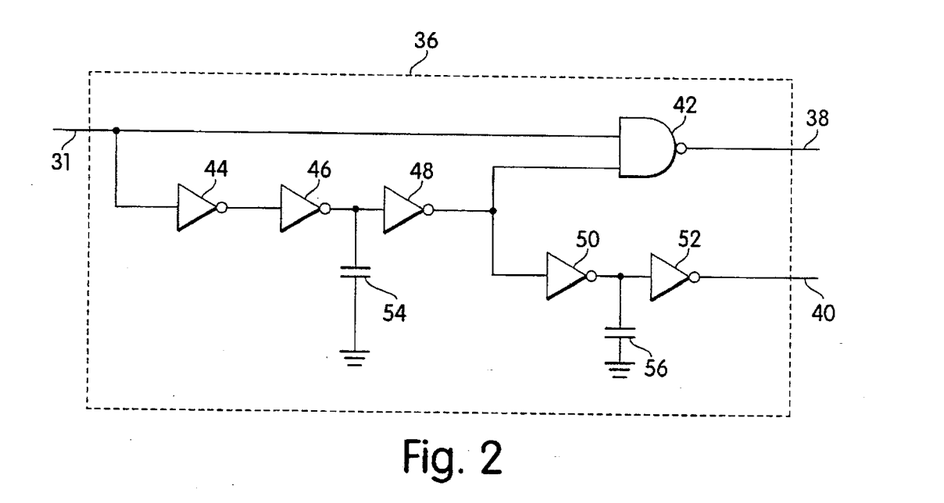
FIG. 2 is a schematic diagram of a one-shot circuit for use in the power-up control circuit of FIG. 1.

Referring to FIG. 2, the input 31 to the one-shot 36 is operatively connected to a first input of a NAND gate 42 and to the input of a first inverter 44. The output of the first inverter is operatively connected to the input of a second inverter 46, and the output of the second inverter is operatively connected to the input of a third inverter 48, as well as to ground via a first capacitor 54. The output of the third inverter is operatively connected to the second input of the NAND gate 42 and to the input of a fourth inverter 50. The output of the fourth inverter is operatively connected to the input of a fifth inverter 52, and to ground via a second capacitor 56. The output of the NAND gate acts as the first output 38 of the one shot. The output of the fifth inverter acts as the second output 40 of the one-shot.

In operation, referring to FIGS. 1–4, the user can connect an external capacitor 34 between the calibration pin 32 and ground. By doing so the user defines the nominal length of a delay between power-up of the IC 10 and the start of calibration. For example, a ten nanofarad capacitor generates a minimum nominal delay of approximately 60 milliseconds.

Figure 3A:
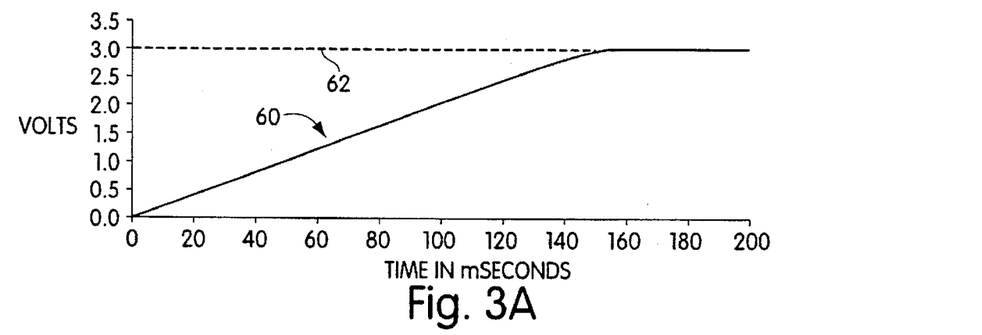
FIG. 3a is a waveform diagram presenting the voltage at the buffer input in the power-up circuit of FIG. 1 during power-up.
Figure 3B:
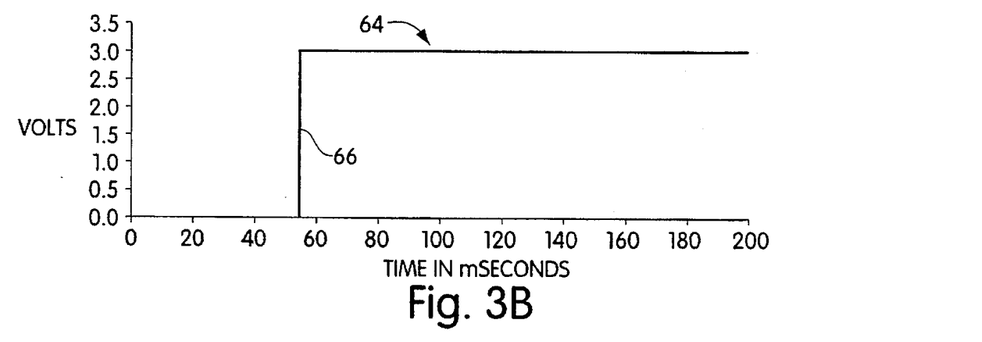
FIG. 3b is a waveform diagram presenting the voltage at the buffer output in the power-up circuit of FIG. 1 during power-up.
Figure 3C:
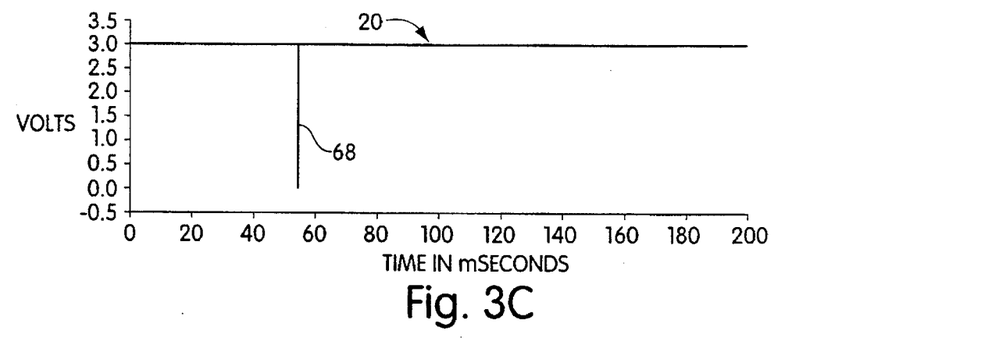
FIG. 3c is a waveform diagram presenting the voltage at the first one-shot output in the power-up circuit of FIG. 1 during power-up.
Figure 3D:
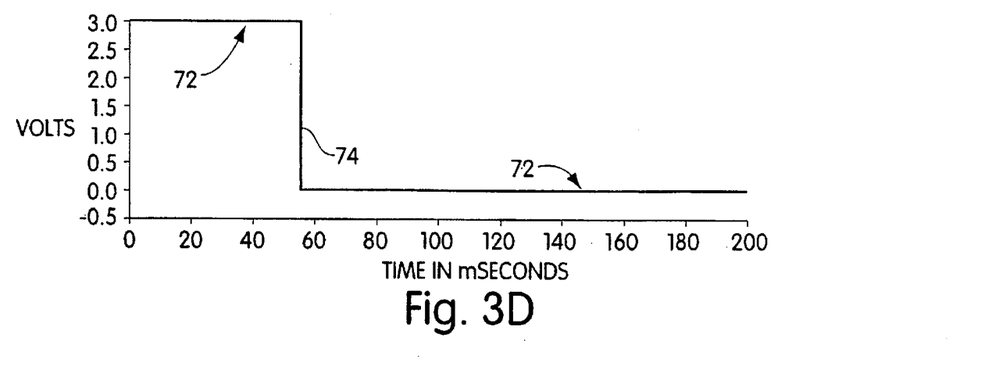
FIG. 3d is a waveform diagram presenting the voltage at the second one-shot output in the power-up circuit of FIG. 1 during power-up.
Figure 4A:
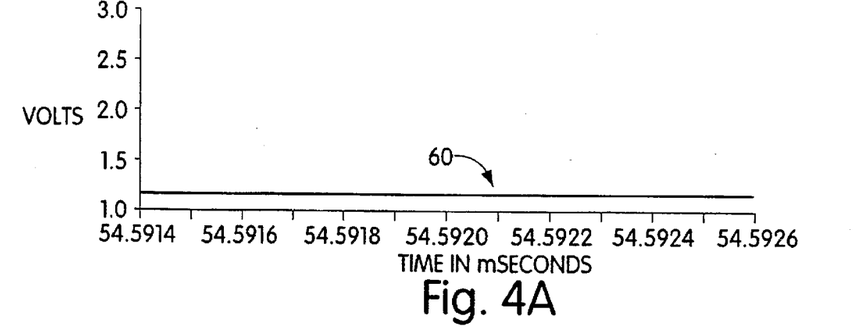
FIG. 4a is a more detailed view of the voltage of FIG. 3a over a shortened range.
Figure 4B:
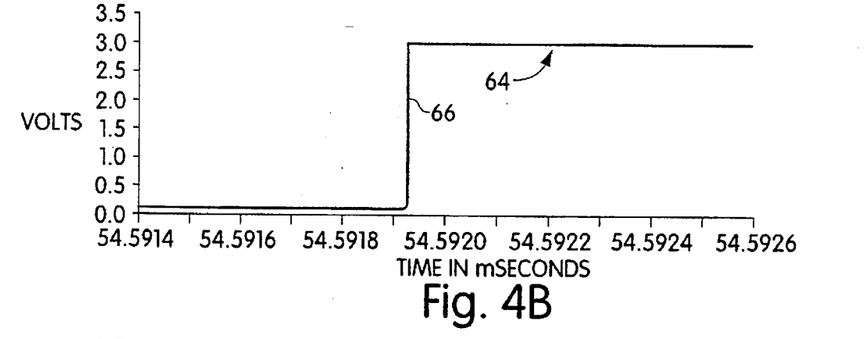
FIG. 4b is a more detailed view of the voltage of FIG. 3b over a shortened range.
Figure 4C:
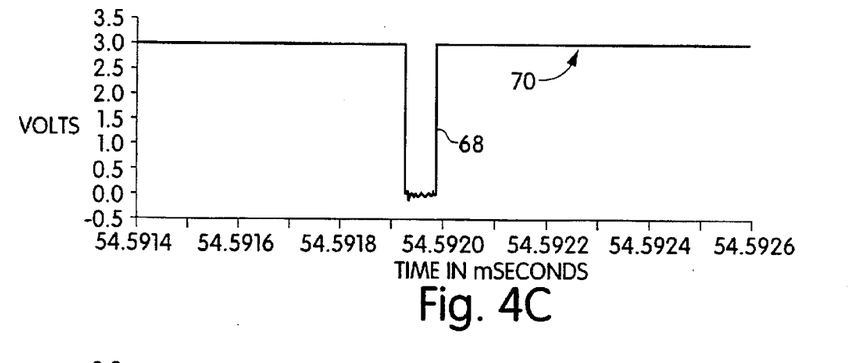
FIG. 4c is a more detailed view of the voltage of FIG. 3c over a shortened range.
Figure 4D:
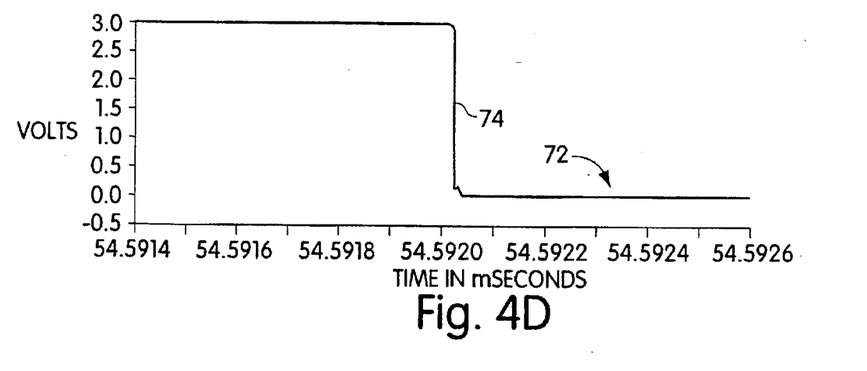
FIG. 4d is a more detailed view of the voltage of FIG. 3d over a shortened range.

Upon applying power to the converter IC 10, a current source in the reference 26 will supply current through the resistor 28 to charge the external capacitor 34. This will cause the voltage 60 at the input of the buffer 30 to increase at a rate determined by the time constant of the current output of the reference current source and the capacitance of the capacitor. This voltage is limited by the supply voltage 62.

When the rising voltage 60 reaches the low-to-high threshold voltage of input buffer 30, its output voltage 64 makes a transition 66 from a logic low to a logic high. This transition causes the one-shot 36 to generate a pulse 68 in its output signal 70 on the first output line 38. After this pulse, the output signal 72 on the second output of the one shot makes a transition 74 from a logic high to a logic low. The pulse on the first output of the one shot serves as a calibration start pulse, and initiates calibration of the analog to digital converter integrated circuit 10 by the calibration circuit 14. The state of the second output indicates whether the calibration start pulse has yet been provided to the calibration circuit.

The one-shot 36 produces the signals 70, 72 at its first and second outputs 38, 40 as follows. When the low-to-high transition 66 occurs in the output voltage 64 on the output 31 of the buffer 30, it reaches the first input of the NAND gate 42 immediately, but it is inverted and delayed by the first, second, and third inverters 44, 46, 48, and the first capacitor 54 before it reaches the second input of the NAND gate. During this propagation interval, the NAND gate produces the output pulse 68 in the voltage at the first output of the one-shot. The inverted transition at the output of the third inverter 48 is further delayed by the fourth and fifth inverters 50, 52 and the second capacitor 56 before resulting in the high-to-low transition 74 in the output signal at the second output 40 of the one-shot.

In short, when the user provides power to the converter integrated circuit 10, a delay interval begins, at the end of which the calibration circuit 14 is activated. By choosing an appropriate value for the external capacitor 34, this interval can be defined to be sufficiently long to allow the reference 26 to reach its normal operating conditions. Since the circuitry in the charge redistribution integrated circuit can be designed to be relatively temperature insensitive and the reference usually drives a relatively large capacitance in this type of integrated circuit, the settling of the reference can be made to be the primary source of error before the part has reached its normal operating conditions.

The rate at which the reference 26 settles is related to the magnitude of the current flowing through the reference. Because the current used to charge the external capacitor 34 is derived from the reference, the rate of charging of this capacitor will track the rate at which the reference reaches normal operating conditions. Conditions that might delay the reference reaching operating conditions, such as uneven ramp-up of the supply voltage, will also slow the charging of the external capacitor and result in a delay that is longer than normal. This matching effect allows a capacitor to be used that minimizes the time in which the integrated circuit is ready to perform conversions, while still ensuring that the reference is at its normal operating conditions before calibration.

If an external reference is used, its output voltage and/or output impedance may be different from those of the internal reference, and the external capacitor 34 can be matched to those characteristics. For example, a reference with a lower output impedance may be able to charge capacitors in the IC 10 more quickly and thereby reach normal operating conditions sooner. This would allow the user to provide a smaller external capacitor for the power-up calibration control circuit. Since charging current for the external capacitor is derived from the external reference, the charging of the capacitor may also exhibit some tracking of the conditions at the reference during power-up, as described above.

Users who do not wish to use the automatic power-up feature of the integrated circuit 10 can omit the external capacitor 34 and provide a TTL-compatible input signal to the calibration pin 32. With this configuration, the user can use hardware signals to determine when calibration occurs. If desired, the user can instead combine the techniques by leaving the external capacitor 34 in place and also providing a TTL compatible output on the calibration pin 32, which output is capable of operating in the presence of the external capacitor. Using this approach, the user will obtain the benefits of automatic power-up calibration, while retaining the ability to cause the integrated circuit to perform its calibration operation under hardware control.

The hold transistor 27 is provided to prevent the external capacitor 34 from discharging when the IC 10 enters shutdown mode. It bypasses the shutdown circuit 17 to keep the external capacitor in operative connection with the positive analog supply pin 23. It is observed that the bus interface can receive power through a separate positive supply pin 25, so a microprocessor can still communicate with the IC when it is in shutdown mode.

Figure 5:
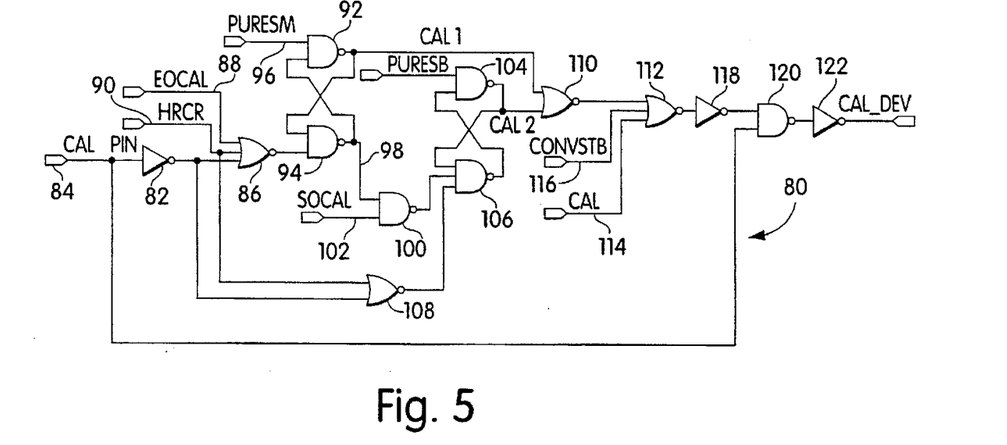
FIG. 5 is a schematic of an alternative power-up control circuit according to the invention for use in the integrated circuit of FIG. 1.
Figure 6A:
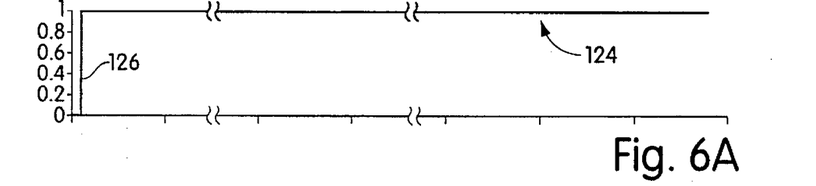
FIG. 6a is a timing diagram illustrating the power-up reset signal produced for the circuit of FIG. 5 during power-up.
Figure 6B:
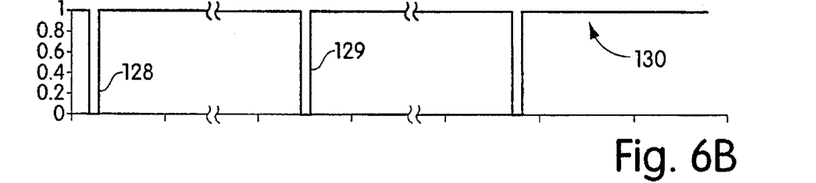
FIG. 6b is a timing diagram illustrating the conversion start signal produced for the circuit of FIG. 5 during power-up.
Figure 6C:
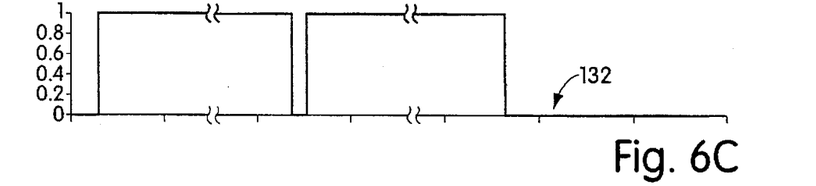
FIG. 6c is a timing diagram illustrating the calibration in progress signal produced for the circuit of FIG. 5 during power-up.
Figure 6D:
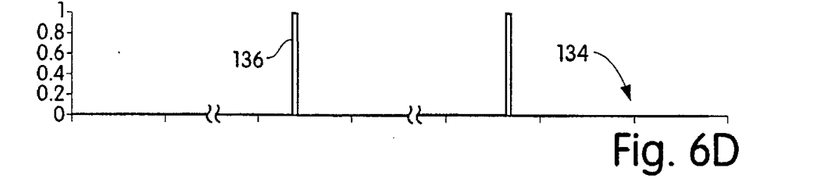
FIG. 6d is a timing diagram illustrating the end of calibration signal produced for the circuit of FIG. 5 during power-up.
Figure 6E:
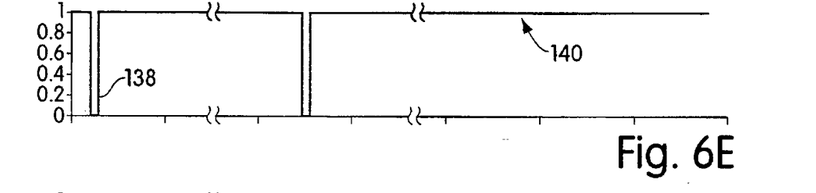
FIG. 6e is a timing diagram illustrating the calibration control signal produced by the circuit of FIG. 5 during power-up.
Figure 6F:
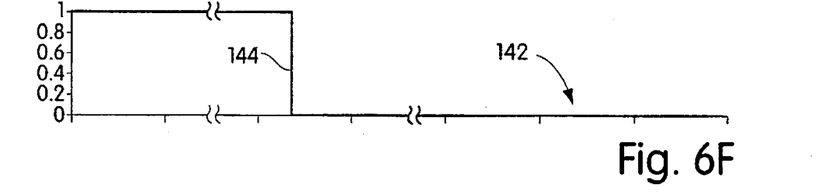
FIG. 6f is a timing diagram illustrating the signal produced by the first latch circuit of FIG. 5 during power-up.
Figure 6G:
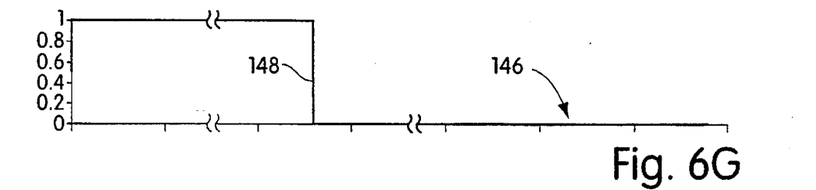
FIG. 6g is a timing diagram illustrating the signal produced by the second latch circuit of FIG. 5 during power-up.

Referring to FIGS. 5–6, an alternative control circuit 80 to the automatic power-up control circuit 16 of the first embodiment 10 is presented. This alternative power-up circuit does not require an external calibration pin, so it does not rely on a dedicated external capacitor. Normally, however, this circuit will have a periodic conversion start signal 130 available, or the user will be able to ignore the converter digital output during calibration operations. A power-up reset signal, which is asserted on a power-up reset line 96 just after power is applied to the IC, is also made available.

The alternative power-up control circuit 80 includes a first inverter 82 operatively connected to an optional calibration pin 84. The output of this inverter is operatively connected to one of three inputs of a first NOR gate 86, with the remaining two inputs being used for an end of calibration signal 88 from the calibration circuit 14 and a write control register signal line 90. The output of the first NOR gate 86 is operatively connected to the reset input of a first R-S latch made up of first and second NAND gates 92, 94, and the power-up reset line 96 is provided to the set input of this latch. The reset output 98 of the latch is operatively connected to a first input of a third NAND gate 100. The second input of this third NAND gate receives a brief start of calibration signal on a start-up calibration line 102 from the calibration circuit.

The output of the third NAND gate 100 is operatively connected to one of two reset inputs of a second R-S latch made up of fifth and sixth NAND gates 104, 106. The other reset input to this latch is from the output of a second NOR gate 108. This second NOR gate 108 has inputs operatively connected to the output of the first inverter 82 and the write control register signal line 90. The power-up reset line 96 is operatively connected to the set input of the second R-S latch. The set output of the first R-S latch (see signal 140 in FIG. 6f) and the set output of the second R-S latch (see signal 142 in FIG. 6g) are each operatively connected to an input of a third NOR gate 110. The output of the third NOR gate is operatively connected to a fourth NOR gate 112, which also receives the conversion start line 116 and a calibration in progress line 114.

The output of the fourth NOR gate 112 is operatively connected to a second inverter 118, and its output is operatively connected to the first input of a sixth NAND gate 120, which is also operatively connected to the optional calibration pin input line 84. The output of the sixth NAND gate is operatively connected to a third inverter 122, and the output of the third inverter supplies the first calibration command signal 140 to the calibration circuit 14. Note that a second signal output akin to the second output 40 of the one-shot 30 in FIGS. 1–2 is not shown, but that one skilled in the art could readily devise circuitry to provide it.

In operation, shortly (i.e., a few microseconds) after the IC receives power, the power-up reset signal 124 on the power-up reset line 96 makes a low-to-high transition 126. This sets both of the latches. A first conversion start pulse 128 on the conversion start line 116 then propagates through to the output of the third inverter 122, where it serves as a calibration start pulse 138 which initiates a first calibration. This calibration takes approximately 32 milliseconds, which provides sufficient time for the reference to settle. At the end of this calibration, the calibration circuit provides a pulse 136 in the end of calibration signal 134 on the end of calibration line 88. This pulse resets the first latch (edge 144).

The next conversion start pulse 129 then initiates a second calibration. This overwrites any results stored from the first calibration and provides accurate results, since the reference voltage has now settled. When the calibration circuit begins this second calibration, it provides a start of calibration signal on the start of calibration line 102, and this resets the second latch (edge 148).

If a write control register signal is provided on the write control register signal line 90 during operation of the power-up circuit 80, it will stop the power-up calibration sequence. This will allow a user to perform a conversion, even though it may be inaccurate, immediately after power-up of the circuit. The write register signal reflects any writing to the control register, and can be derived from the read/write line 29.

The calibration circuit 14 needs to generate four status signals for the alternative power-up control circuit 80. These include the start of calibration signal, the end of calibration signal 134, and the calibration in progress signal 132. The circuitry used to derive these signals is not shown, so as not to obfuscate the invention, as its design would be straightforward to one of skill in the art. The power-up reset signal 126 can be generated by a small on-chip delay circuit. The optional calibration pin 84 can be used to initiate a calibration either during operation of the power-up control circuit, or thereafter.

Other power-up circuits could be used instead of the ones presented above. For example, the power-up delay could be determined by an on-chip counter, or other on-chip circuitry. Such circuitry can be designed to match the settling characteristics of the reference.

Figure 7:
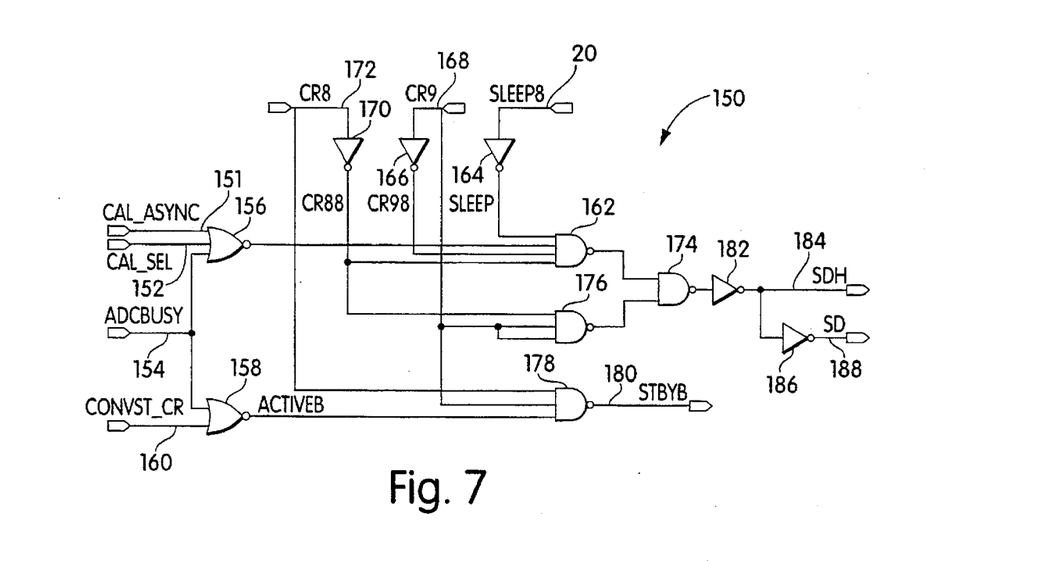
FIG. 7 is a schematic diagram of the power management control circuit of the integrated circuit of FIG. 1.

Referring to FIGS. 1 and 7, a power management circuit 150 for use in connection with the automatic power-up circuit of FIG. 1 is shown. This power management control circuit includes a first NOR gate 156 operatively connected to a line 151 that receives an inverted version of the signal on the calibration pin 32 of the IC 10, a calibration started signal line 152 from the calibration circuit 14, and an ADC busy signal line 154 from the ADC 12. A second NOR gate 158 also receives the ADC busy signal line as well as a convert start signal 160 from the control register 11.

A first NAND gate 162 is operatively connected to the output of a first inverter 164, which has an input operatively connected to the sleep pin 20. The first NAND gate is also operatively connected to the output of a second inverter 166, which has an input operatively connected to the ninth control bit 168 in the control register 11. The first NAND gate is further operatively connected to the output of a third inverter 170, which has an input operatively connected to the eighth control bit 172 in the control register. The output of the first NAND gate 162 is operatively connected to an input of a second NAND gate 174. A third NAND gate 176 has inputs operatively connected to the output of the third inverter 170, as well as the ninth control bit 168. Its output is operatively connected to the second NAND gate.

A fourth NAND gate 178 is operatively connected to the output of the second NOR gate 158, the eighth control bit 172, and the ninth control bit 168. Its output acts as a stand-by control line 180, which instructs the stand-by circuit 19 to enter stand-by mode. The output of the second NAND gate 174 is operatively connected to a fourth inverter 182, and the output of the fourth inverter 182 is provided as an inverted shutdown output 184 which instructs the stand-by circuit to enter shutdown mode. A fifth inverter 186 operatively connected to the inverted shutdown output provides as its output a noninverted shutdown control line 188.

In operation, the power management logic 150 implements the following modes.

TABLE 1

| CR9 | CR8 | SLEEP PIN | Function |
| --- | --- | --- | --- |
| 0 | 0 | 0 | Shutdown if Not (Calibrating + Converting) |
| 0 | 0 | 1 | Normal operation |
| 0 | 1 | X | Normal operation (Independent of sleep pin) |
| 1 | 0 | X | Shutdown |
| 1 | 1 | X | Standby mode if Not (Converting) |

The first two lines of Table 1 show the default mode for the IC 10. The integrated circuit enters this state upon power-up, or when the eighth bit CR8 and the ninth bit CR9 of the control register are both set to zero. If the sleep pin is held high in this state, the circuit will operate normally. If the sleep pin is tied low, however, the integrated circuit will enter shutdown mode if it is not calibrating or converting.

This mode is particularly useful where power consumption is an important consideration, and where conversions are not performed constantly. Because it is the default mode, the user can just leave the sleep pin low and does not need to program the eighth and ninth control register bits at power-up. This allows the user to treat the integrated circuit like a low-power black box that simply provides digital values, but which takes full advantage of calibration and shutdown circuits.

By setting CR9 to zero and CR8 to one, the IC will assume normal operation independent of the state of the sleep pin (line three of table I). Setting CR9 to one and CR8 to zero, will direct the IC to shut down completely until a further control command is received (line four of table I). In this state, only a small leakage current is consumed.

If the user sets both CR9 and CR8 to one, the device enters stand-by mode, when it is not performing conversions. In standby-mode, the reference is left on, but much of the remaining analog circuitry is starved of current. This stand-by mode consumes more power than the shutdown mode, but because the reference is left running, conversions can be started again more quickly than they could be from shutdown mode, although not as quickly as they would if the part were to remain in normal operation.

It is contemplated that similar power management circuitry to that shown in FIG. 7 could be used with the power-up circuitry of FIG. 5. It is also contemplated that the principles of the invention could be applied to the other type of analog/digital converters, digital-to-analog converters (DAC's). Furthermore, the principles of the invention can also be used in calibrated analog/digital converters that employ other conversion techniques, such as resistive ladder converters.

While there have been shown and described what are at present considered the preferred embodiments of the present invention, these embodiments are illustrated by way of example only. It will be obvious to those skilled in the art that various changes and modifications may be made therein without departing from the scope of the invention as defined by the appended claims.

What is claimed is:

1. An analog/digital converter integrated circuit, comprising:

a power supply pin, a monolithic circuit operatively connected to the power supply pin, comprising:

an analog/digital converter circuit implemented in the monolithic circuit and having a power supply input port operatively connected to the power supply pin of the integrated circuit, an analog signal port, and a digital data port, a calibration circuit having a calibration initiation control input implemented in the monolithic circuit and being operatively connected to the analog/digital converter circuit, and a power-up delay circuit implemented in the monolithic circuit and operatively connected to the power supply pin of the integrated circuit and operatively connected to the initiation control input of the calibration circuit.

2. An analog/digital converter integrated circuit, comprising:

an analog/digital converter circuit having a power supply input port, an analog signal port, and a digital data port, a calibration circuit having a calibration initiation control input and being operatively connected to the analog/digital converter circuit, a power-up delay circuit operatively connected to the initiation control input of the calibration circuit, and an external power-up capacitor pin, wherein the power-up delay circuit is operatively connected to the external power-up capacitor pin.

3. An analog/digital converter integrated circuit, comprising:

an analog/digital converter circuit having a power supply input port, an analog signal port, and a digital data port, a calibration circuit having a calibration initiation control input and being operatively connected to the analog/digital converter circuit, a power-up delay circuit operatively connected to the initiation control input of the calibration circuit, and a reference circuit, wherein the analog/digital converter circuit further has a reference input operatively connected to the reference circuit, and wherein the power-up delay circuit is operatively connected to the reference.

4. The analog/digital converter integrated circuit of claim 3 wherein the analog/digital converter circuit is a charge-redistribution analog-to-digital converter, wherein the analog signal port is an analog input pin, and wherein the digital data port is a digital data ouput port.

5. The analog/digital converter integrated circuit of claim 4 further including a power control circuit for automatically placing the circuit in an operating mode upon power-up that keeps the integrated circuit in shutdown mode when the IC is not converting or calibrating.

6. The analog/digital converter integrated circuit of claim 3 wherein the reference circuit includes an on-chip voltage reference and an on-chip bias current source, and wherein the power-up delay circuit is operatively connected to the on-chip bias current source.

7. The analog/digital converter integrated circuit of claim 6 wherein the power-up delay circuit is operatively connected to the on-chip bias current source, and wherein the analog/digital converter circuit is a charge-redistribution analog-to-digital converter, wherein the analog signal port is an analog input pin, and wherein the digital data port is a digital data ouput port.

8. The analog/digital converter integrated circuit of claim 7 further including a power control circuit for automatically placing the circuit in an operating mode upon power-up that keeps the integrated circuit in shutdown mode when the IC is not converting or calibrating.

9. The analog/digital converter integrated circuit of claim 3 wherein the reference circuit includes an external reference pin.

10. An analog/digital converter integrated circuit, comprising:

an analog/digital converter circuit having a power supply input port, an analog signal port, and a digital data port, wherein the analog/digital converter circuit is a charge-redistribution analog-to-digital converter, wherein the analog signal port is an analog input pin, and wherein the digital data port is a digital data output port, a calibration circuit having a calibration initiation control input and being operatively connected to the analog/digital converter circuit, and a power-up delay circuit operatively connected to the initiation control input of the calibration circuit.

11. An analog/digital converter integrated circuit, comprising:

an analog/digital converter circuit having a power supply input port, an analog signal port, and a digital data port, a calibration circuit having a calibration initiation control input and being operatively connected to the analog/digital converter circuit, and a power-up delay circuit operatively connected to the initiation control input of the calibration circuit, wherein the calibration circuit includes status outputs operatively connected to the power-up delay circuit.

12. The analog/digital converter integrated circuit of claim 7 wherein the power-up delay circuit includes a pair of latches operatively connected to the status outputs.

13. The analog/digital converter integrated circuit of claim 8 wherein the power-up delay circuit is constructed and adapted to operate without any external calibration pin on the integrated circuit.

14. The analog/digital converter integrated circuit of claim 13 further including a power control circuit for automatically placing the circuit in an operating mode upon power-up that keeps the integrated circuit in shutdown mode when the IC is not converting or calibrating.

15. An analog/digital converter integrated circuit, comprising:

an analog/digital converter circuit having a power supply input port, analog signal port, and a digital data port, a calibration circuit having a calibration initiation control input and being operatively connected to the analog/digital converter circuit, and a power-up delay circuit operatively connected to the initiation control input of the calibration circuit, wherein the power-up delay circuit is constructed and adapted to operate without any external calibration pin on the integrated circuit.

16. An analog/digital converter integrated circuit, comprising:

an analog/digital converter circuit having a power supply input port, an analog signal port, and a digital data port, a calibration circuit having a calibration initiation control input and being operatively connected to the analog/digital converter circuit, a power-up delay circuit operatively connected to the initiation control input of the calibration circuit, and a power control circuit for automatically placing the circuit in an operating mode upon power-up that keeps the integrated circuit in shutdown mode when the IC is not converting or calibrating.

17. A method of calibrating an analog/digital converter integrated circuit, comprising:

providing power to the analog/digital converter integrated circuit from an external power supply to a power pin on the analog/digital converter integrated circuit, generating a delayed signal, said signal being delayed from the occurrence of the step of providing power from the external power supply to the power pin on the analog/digital converter integrated circuit by a power-up delay circuit on the integrated circuit, and initiating by a calibration circuit on the integrated circuit a calibration of an analog/digital converter on the integrated circuit upon detecting the delayed signal generated in the generating step.

18. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, deriving a reference on the integrated circuit, and wherein the step of generating a delayed signal includes the step of deriving the duration of a delay of the delayed signal from the reference derived in the deriving step, and initiating a calibration of the analog/digital converter upon detecting the delayed signal generated in the generating step.

19. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, wherein the step of generating a delayed signal generates the delayed signal with a delay that is nominally less than about 30 milliseconds in length, and initiating a calibration of the analog/digital converter upon detecting the delayed signal generated in the generating step.

20. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, initiating a calibration of the analog/digital converter upon detecting the delayed signal generated in the generating step, and initiating a calibration in response to a signal external to the integrated circuit on a calibration input pin of the integrated circuit.

21. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, initiating a calibration of the analog/digital converter upon detecting the delayed signal generated in the generating step, and placing the integrated circuit into an operating mode upon power-up that keeps the integrated circuit in shutdown mode except when it is converting or calibrating without receiving an external command instructing the integrated circuit to enter the operating mode.

22. The method of claim 21 wherein the step of generating a delayed signal derives the duration of a delay of the delayed signal from a duration of a calibration operation.

23. The method of claim 22 wherein the step of calibrating the converter includes the step of adjusting the capacitance of a capacitor in the converter using a switched array of capacitors.

24. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, wherein the step of generating a delayed signal derives the duration of a delay of the delayed signal from a duration of a calibration operation, and initiating a calibration of the analog/digital converter upon detecting the delayed signal generated in the generating step.

25. A method of calibrating an analog/digital converter integrated circuit, comprising:

providing power to the analog/digital converter integrated circuit, generating a delayed signal, said signal being delayed from the occurrence of the step of providing power by a power-up delay circuit on the integrated circuit, wherein the step of generating a delayed signal includes a step of charging a capacitor external to the integrated circuit, and wherein the step of generating the delayed signal derives the duration of a delay of the delayed signal from the charging step, and initiating a calibration of the analog/digital converter upon detecting the delayed signal generated in the generating step.

26. The method of claim 25 further including the step of deriving a reference on the integrated circuit, and wherein the step of generating a delayed signal includes the step of deriving the duration of the delay from the reference derived in the deriving step, and further including the step of initiating a calibration in response to a signal external to the integrated circuit on a calibration input pin of the integrated circuit.

27. The method of claim 26 further including the step of placing the integrated circuit into an operating mode upon power-up that keeps the integrated circuit in shutdown mode except when it is converting or calibrating without receiving an external command instructing the integrated circuit to enter the operating mode.

28. The method of claim 27 wherein the step of calibrating the converter includes the step of adjusting the capacitance of a capacitor in the converter using a switched array of capacitors.

29. A method of calibrating an analog/digital converter integrated circuit, comprising:

provinding power to the analog/digital converter integrated circuit, generating a delayed signal, said signal being delayed from the occurrence of the step of providing power by a power-up delay circuit on the integrated circuit, and initiating a calibration of the analog/digital converter upon detecting the delayed signal generated in the generating step, wherein the calibration initiated in the step of initiating a calibration of the converter includes the step of adjusting the capacitance of a capacitor in the converter using a switched array of capacitors.

30. A circuit for calibrating an analog/digital converter integrated circuit, comprising:

power supply pin means for providing power from an external power supply to the analog/digital converter integrated circuit, power-up delay means responsive to the power supply pin means on the integrated circuit for generating a signal delayed from power-up of the integrated circuit, and means on the integrated circuit and responsive to the power supply pin means and to the power-up delay means for initiating a calibration of the analog/digital converter upon detecting the delayed signal.

31. A circuit for calibrating an analog/digital converter integrated circuit, comprising:

means for providing power to the analog/digital converter integrated circuit, power-up delay means on the integrated circuit for generating a signal delayed from power-up of the integrated circuit, means responsive to the power-up delay means for initiating a calibration of the analog/digital converter upon detecting the delayed signal, and means for deriving a reference on the integrated circuit, and wherein the power-up delay means includes means for deriving the duration of a delay of the delayed signal from the means for deriving a reference.

32. A circuit for calibrating an analog/digital converter integrated circuit, comprising:

means for providing power to the analog/digital converter integrated circuit, power-up delay means on the integrated circuit for generating a signal delayed from power-up of the integrated circuit, and means responsive to the power-up delay means for initiating a calibration of the analog/digital converter upon detecting the delayed signal, wherein the means for initiating a calibration further includes means for initiating a calibration in response to a signal external to the integrated circuit on a calibration input pin of the integrated circuit.

33. A circuit for calibrating an analog/digital converter integrated circuit, comprising:

means for providing power to the analog/digital converter integrated circuit, power-up delay means on the integrated circuit for generating a signal delayed from power-up of the integrated circuit, means responsive to the power-up delay means for initiating a calibration of the analog/digital converter upon detecting the delayed signal, and means for placing the integrated circuit into an operating mode upon power-up that keeps the integrated circuit in shutdown mode except when it is converting or calibrating without receiving an external command instructing the integrated circuit to enter the operating mode.

34. The circuit of claim 33 wherein the power-up delay means includes means for deriving the duration of a delay of the delayed signal from a duration of a calibration operation.

35. The circuit of claim 34 further including means responsive to the power-up delay means for calibrating the converter, which means for calibrating includes means for adjusting the capacitance of a capacitor in the converter using a switched capacitor array means.

36. A circuit for calibrating an analog/digital converter integrated circuit, comprising:

means for providing power to the analog/digital converter integrated circuit, power-up delay means on the integrated circuit for generating a signal delayed from power-up of the integrated circuit, wherein the power-up delay means includes means for deriving the duration of a delay of the signal from a duration of a calibration operation, and means responsive to the power-up delay means for initiating a calibration of the analog/digital converter upon detecting the delayed signal.

37. A circuit for calibrating an analog/digital converter integrated circuit, comprising:

means for providing power to the analog/digital converter integrated circuit, power-up delay means on the integrated circuit for generating a signal delayed from power-up of the integrated circuit, wherein the power-up delay means includes means for charging a capacitor external to the integrated circuit, and wherein the power-up delay means includes means for deriving the duration of a delay of the delayed signal from the means for charging, and means responsive to the power-up delay means for initiating a calibration of the analog/digital converter upon detecting the delayed signal.

38. The circuit of claim 37 further including means for deriving a reference on the integrated circuit, and wherein the power-up delay means includes means for deriving the duration of the delay from the means for deriving a reference, and wherein the means for initiating a calibration further includes means for initiating a calibration in response to a signal external to the integrated circuit on a calibration input pin of the integrated circuit.

39. The circuit of claim 38 further including means for placing the integrated circuit into an operating mode upon power-up that keeps the integrated circuit in shutdown mode except when it is converting or calibrating without receiving an external command instructing the integrated circuit to enter the operating mode.

40. The circuit of claim 39 further including means responsive for the power-up delay means for calibrating the converter, which means for calibrating includes means for adjusting the capacitance of a capacitor in the converter using a switched capacitor array means.

41. A circuit for calibrating an analog/digital converter integrated circuit, comprising:

means for providing power to the analog/digital converter integrated circuit, power-up delay means on the integrated circuit for generating a signal delayed from power-up of the integrated circuit, means responsive to the power-up delay means for initiating a calibration of the analog/digital converter upon detecting, the delayed signal, and means responsive to the power-up delay means for calibrating the converter, which means for calibrating includes means for adjusting the capacitance of a capacitor in the converter using a switched capacitor array means.

* * * * *

UNITED STATES PATENT AND TRADEMARK OFFICE
Certificate

Patent No. 5,668,551                                         Patented: September 16, 1997

On petition requesting issuance of a certificate for correction of inventorship pursuant to 35 U. S. C. 256, it has been found that the above-identified patent, through error and without any deceptive intent, improperly sets forth the inventorship.

Accordingly, it is hereby certified that the correct spelling of the second joint inventor of this patent is: Eamonn Byrne.

Signed and Sealed this Twenty-First Day of April, 1998.

BRIAN W. BROWN
*Special Programs Examiner*
Examining Group 2100
Industrial Electronics, Physics,
and Related Elements